(12) United States Patent
Honda et al.

(10) Patent No.: US 7,749,914 B2
(45) Date of Patent: Jul. 6, 2010

(54) PLASMA ETCHING METHOD

(75) Inventors: Masanobu Honda, Nirasaki (JP);
Kazuya Nagaseki, Nirasaki (JP);
Hisataka Hayashi, Yokohama (JP)

(73) Assignees: Tokyo Electron Limited, Tokyo (JP);
Kabushiki Kaisha Toshiba, Tokyo (JP)

( * ) Notice: Subject to any disclaimer, the term of this patent is extended or adjusted under 35 U.S.C. 154(b) by 763 days.

(21) Appl. No.: 10/960,538

(22) Filed: Oct. 8, 2004

(65) Prior Publication Data

US 2005/0082256 A1 Apr. 21, 2005

(51) Int. Cl.
*H01L 21/302* (2006.01)

(52) U.S. Cl. .................. 438/714; 438/706; 438/725; 216/67

(58) Field of Classification Search .......... 438/706, 438/710, 714, 725, 712, 720, 732; 216/67, 216/71, 59
See application file for complete search history.

(56) References Cited

U.S. PATENT DOCUMENTS

| | | | |
|---|---|---|---|
| 5,242,539 A | | 9/1993 | Kumihashi et al. |
| 6,706,138 B2 * | | 3/2004 | Barnes et al. ............ 156/345.1 |
| 6,962,879 B2 * | | 11/2005 | Zhu et al. .................. 438/724 |
| 7,022,616 B2 | | 4/2006 | Mimura et al. |
| 2004/0097079 A1 | | 5/2004 | Mimura et al. |
| 2005/0039854 A1 * | | 2/2005 | Matsuyama et al. .... 156/345.44 |

FOREIGN PATENT DOCUMENTS

| | | |
|---|---|---|
| JP | 03-204925 | 9/1991 |
| JP | 05-006872 | 1/1993 |
| JP | 5-259119 | 10/1993 |
| JP | 2002-93776 | 3/2002 |
| JP | 2002-093776 | 3/2002 |
| JP | 2002-543613 | 12/2002 |
| WO | 00/79586 | 12/2000 |

OTHER PUBLICATIONS

Wolf et al., Silicon Processing for the VLSI Era, 1986, Lattice Press, vol. 1, pp. 336-337, 544-547, 551-552, 570-571.*

(Continued)

*Primary Examiner*—Lan Vinh
(74) *Attorney, Agent, or Firm*—Smith, Gambrell & Russell, LLP

(57) ABSTRACT

The present invention is a plasma etching method including: an arranging step of arranging a pair of electrodes oppositely in a chamber and making one of the electrodes support a substrate to be processed in such a manner that the substrate is arranged between the electrodes, the substrate having an organic-material film; and an etching step of applying a high-frequency electric power to at least one of the electrodes to form a high-frequency electric field between the pair of the electrodes, supplying a process gas into the chamber to form a plasma of the process gas by means of the electric field, and plasma-etching the organic-material film of the substrate by means of the plasma partway in order to form a groove having a flat bottom. A frequency of the high-frequency electric power applied to the at least one of the electrodes is 50 to 150 MHz in the etching step.

6 Claims, 9 Drawing Sheets

OTHER PUBLICATIONS

Rossnagel et al., Handbook of Plasma Processing, 1990, Noyes Publications, p. 198.*

Japanese Office Action issued on Apr. 24, 2009 with English translation.

Notification of Receipt of Record Copy (PCT/IB/301) issued for PCT/JP03/04411.

Notification Concerning Submission or Transmittal of Priority Document (PCT/IB/304) issued for PCT/JP03/04411.

PCT Publication No. WO 03/085717 with International Search Report (PCT/ISA/210) issued for PCT/JP03/04411.

Notice Informing the Applicant of the Communication of the International Application to the Designated Offices (PCT/IB/308) issued for PCT/JP03/04411.

* cited by examiner

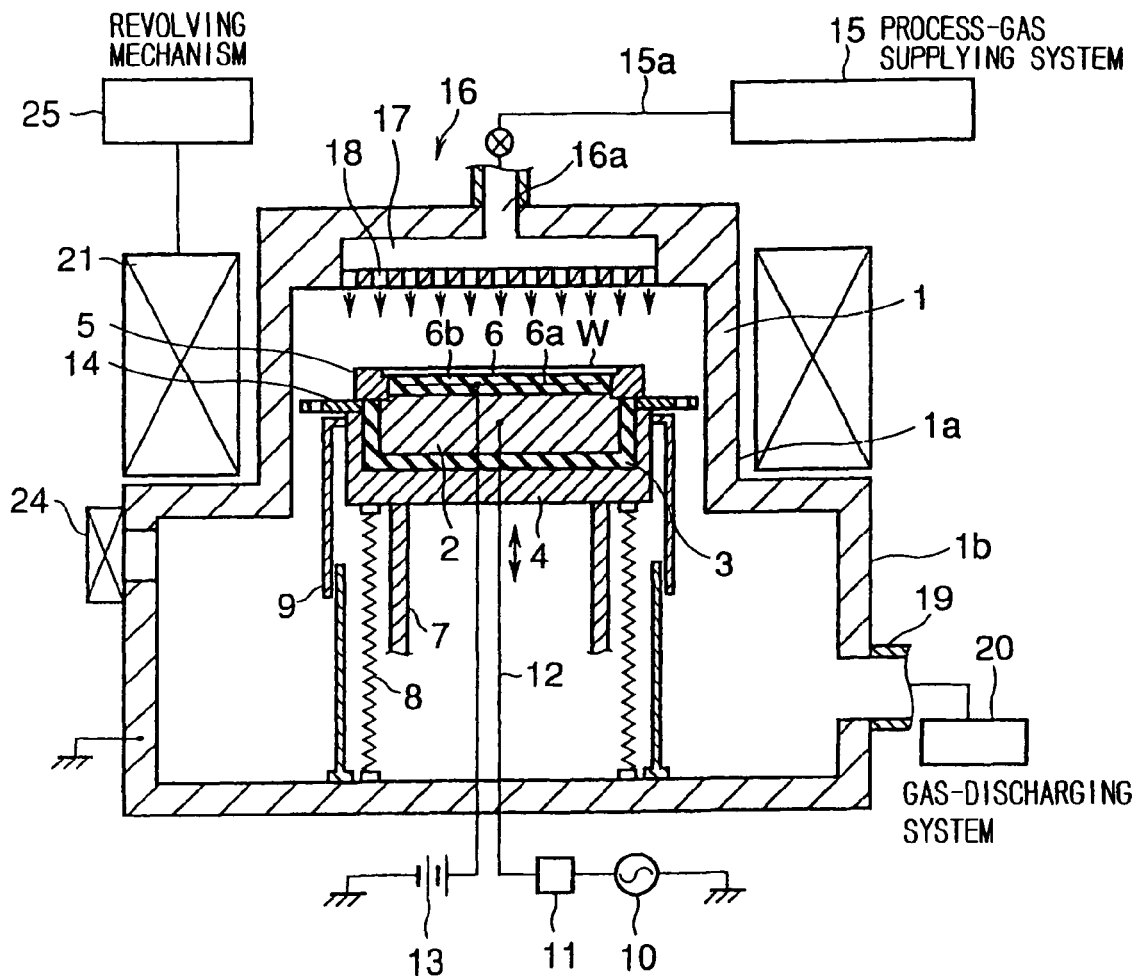
F I G. 1

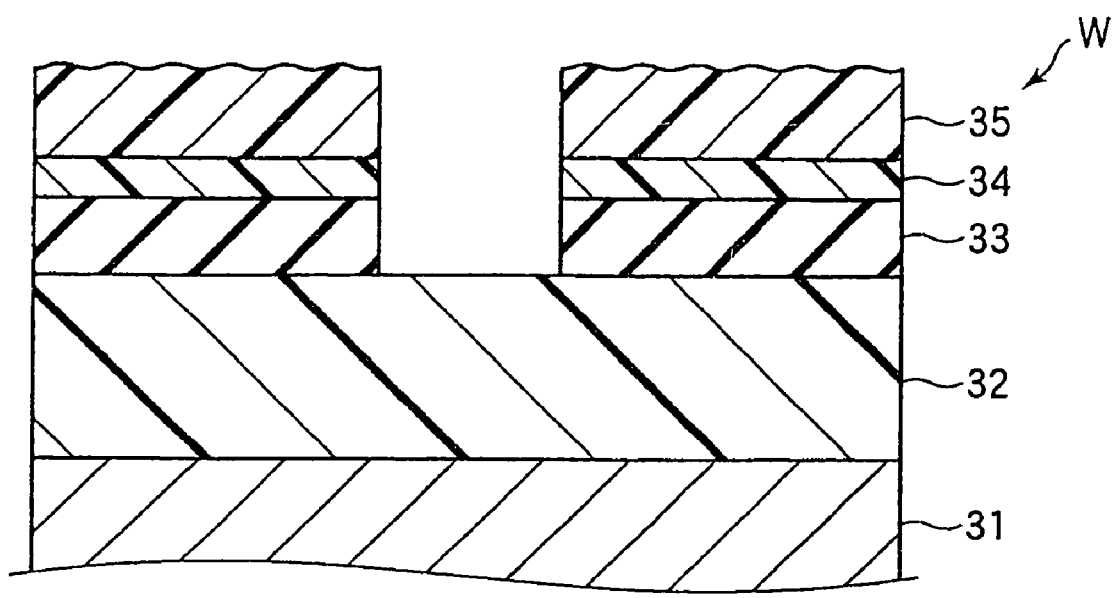
F I G. 5 A
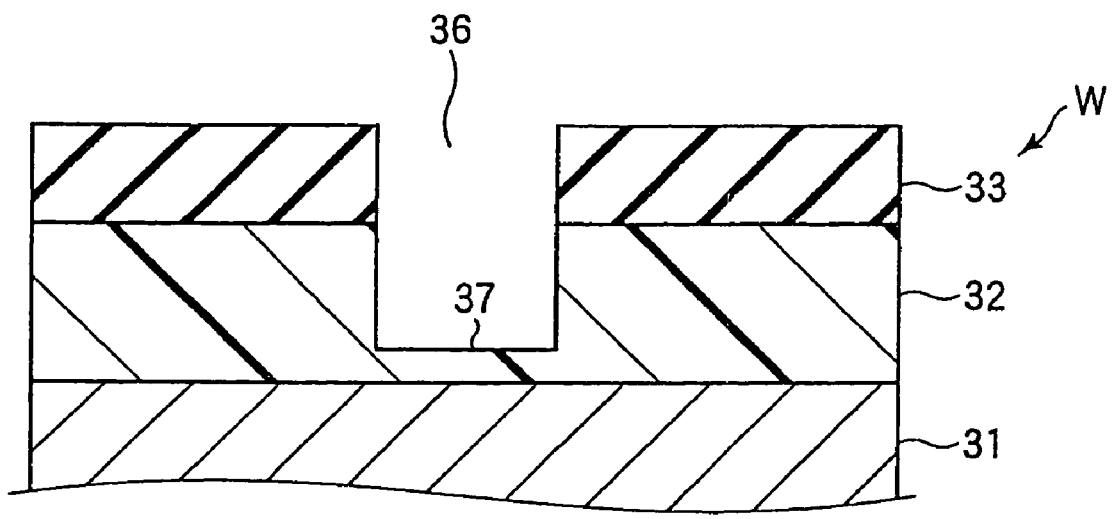
F I G. 5 B

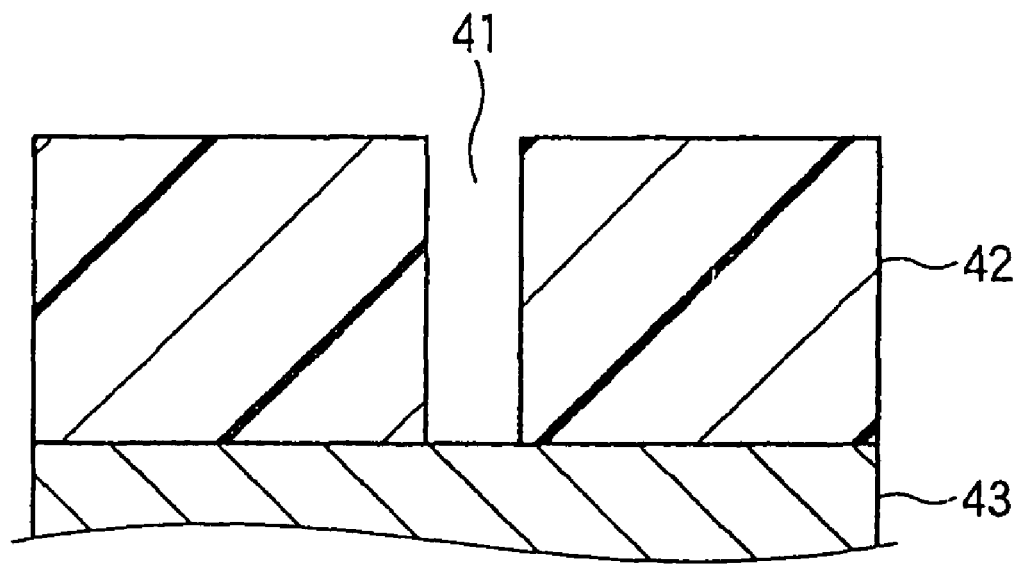
F I G. 15A
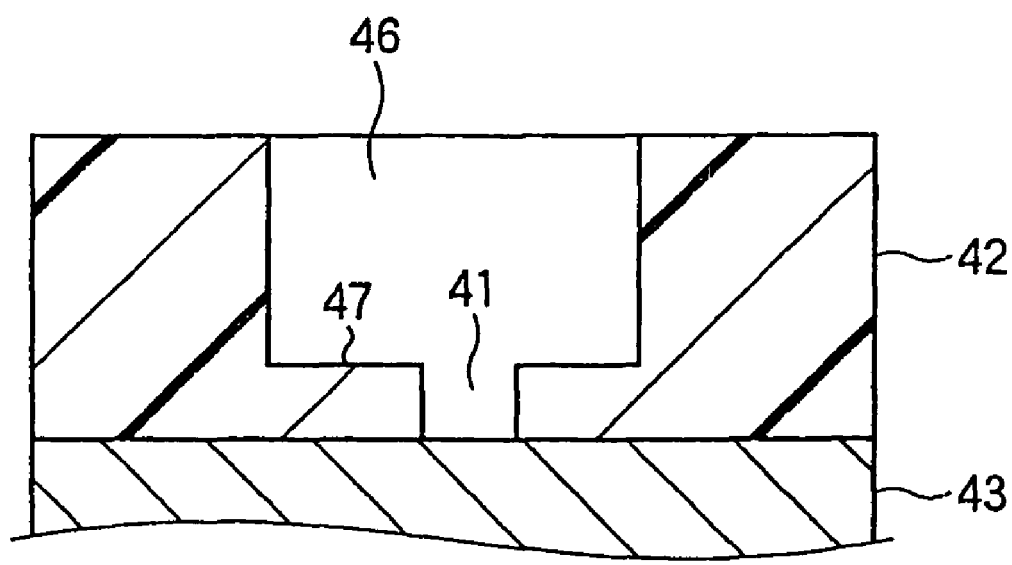
F I G. 15B

_US 7,749,914 B2_

PLASMA ETCHING METHOD

FIELD OF THE INVENTION

The present invention relates to a plasma etching method of partway plasma-etching an organic-material film, such as a low-dielectric-constant film (low-k film), formed on a substrate to be processed, such as a semiconductor wafer.

DESCRIPTION OF THE RELATED ART

In a wiring step of a semiconductor device, an interlayer dielectric film, which has been formed between wiring layers, may be etched in order to electrically connect the wiring layers. Recently, it has been requested to use a film having a lower dielectric constant as the interlayer dielectric film, in order to achieve more speeding-up of the semiconductor device. Some organic-material films have started to be used as such a film having a lower dielectric constant.

Etching process for the organic-material films is carried out by a plasma etching. Specifically, a pair of opposite electrodes is arranged in a chamber in such a manner that the electrodes are vertically opposite, a semiconductor wafer (hereafter, referred to as a mere "wafer") is placed on a lower electrode, and a high-frequency electric power of about 13.56 to 40 MHz is supplied to the lower electrode to carry out the etching process.

However, in a trench etching process for an organic-material film, for example for forming a single damascene structure without a stop-layer or a dual damascene structure, when the etching process is stopped partway along the depth of the film and the bottom of a groove generated by the etching process is flattened, a micro-trenching phenomenon may be caused at an edge portion of the bottom. If the micro-trenching phenomenon is generated, when a filling layer is formed thereafter, the filling layer may be not sufficiently filled into the groove and/or concentration of electric charges may be caused.

SUMMARY OF THE INVENTION

This invention is developed by focusing the aforementioned problems in order to resolve them effectively. An object of the present invention is to provide a plasma etching method that can inhibit generation of a micro-trenching phenomenon, when the organic-material film is plasma-etched partway in order to form a groove having a flat bottom.

According to a result of study by the inventors, in the etching process of the organic-material film, plasma density is dominant, and ion energy contributes only a little. On the other hand, a micro-trenching phenomenon may be caused when the ion energy is large in a perpendicular direction. Thus, in order to inhibit the micro-trenching phenomenon and in order to raise an etching rate of the organic-material film, the plasma density has to be high and the ion energy has to be low to some extent. In the case, the ion energy of the plasma indirectly corresponds to a self-bias electric voltage of an electrode at the etching process. Thus, both in order to inhibit the micro-trenching phenomenon and in order to etch the organic-material film with a high etching rate, finally, it is necessary to etch the organic-material film under a condition of high plasma density and low bias. According to a further result of study by the inventors, when the frequency of the high-frequency electric power applied to the electrode is high, a condition wherein the plasma density is high and the self-bias electric voltage is small can be generated.

The present invention is a plasma etching method comprising: an arranging step of arranging a pair of electrodes oppositely in a chamber and making one of the electrodes support a substrate to be processed in such a manner that the substrate is arranged between the electrodes, the substrate having an organic-material film; and an etching step of applying a high-frequency electric power to at least one of the electrodes to form a high-frequency electric field between the pair of the electrodes, supplying a process gas into the chamber to form a plasma of the process gas by means of the electric field, and plasma-etching the organic-material film of the substrate by means of the plasma partway in order to form a groove having a flat bottom; wherein a frequency of the high-frequency electric power applied to the at least one of the electrodes is 50 to 150 MHz in the etching step.

According to the present invention, since the frequency of the high-frequency electric power applied to the electrode is 50 to 150 MHz, which is higher than prior art, although the plasma has high density, a lower self-bias electric voltage can be achieved. Thus, the organic-material film can be etched with a high etching rate while a micro-trenching phenomenon can be inhibited.

Preferably, in the etching step, a pressure in the chamber is 1.33 to 13.3 Pa.

In addition, preferably, in the etching step, plasma density in the chamber is $5 \times 10^{10}$ to $1 \times 10^{11}$ cm$^{-3}$.

In addition, it is preferable that the high-frequency electric power is applied to an electrode supporting the substrate to be processed. In the case, a second high-frequency electric power of 500 kHz to 27 MHz may be applied to the electrode supporting the substrate to be processed, the second high-frequency electric power being overlapped with the high-frequency electric power. By overlapping the second high-frequency electric power of a lower frequency with the high-frequency electric power, the etching rate can be raised more.

However, on the other hand, by overlapping the second high-frequency electric power with the high-frequency electric power, because of ion drawing effect thereof, the micro-trenching phenomenon may be caused more easily. This problem can be solved by increasing the pressure in the chamber to 53 Pa or more. When the pressure in the chamber is increased, ions may collide with each other and then may be diffused, so that the micro-trenching phenomenon can be effectively inhibited.

Of course, even if the second high-frequency electric power is not overlapped, when the pressure in the chamber is set not lower than 53 Pa, the micro-trenching phenomenon can be inhibited more effectively. However, if the pressure in the chamber is larger than 133 Pa, a CD shift is increased. Thus, it is preferable that the pressure in the chamber is 53 to 133 Pa.

In addition, in order to overlap the second high-frequency electric power with the high-frequency electric power, it is preferable that a self-bias electric voltage of an electrode is not higher than 600 V.

In addition, in the etching step, it is preferable that a residence time of the process gas in the chamber is 70 to 180 msec.

Alternatively, it is preferable that when V (m$^3$) represents an effective chamber volume obtained by multiplying an area of the substrate and a distance between the pair of electrodes together and S (m$^3$/sec) represents an exhaust velocity, the value of V/S is 70 to 180 msec.

In addition, the present invention is a plasma etching method comprising: an arranging step of arranging a pair of electrodes oppositely in a chamber and making one of the electrodes support a substrate to be processed in such a manner that the substrate is arranged between the electrodes, the substrate having an organic-material film; and an etching step of applying a high-frequency electric power to at least one of the electrodes to form a high-frequency electric field between the pair of the electrodes, supplying a process gas into the chamber to form a plasma of the process gas by means of the electric field, and plasma-etching the organic-material film of the substrate by means of the plasma partway in order to form a groove having a flat bottom; wherein in the etching step, a pressure in the chamber is 1.33 to 13.3 Pa, plasma density in the chamber is $5 \times 10^{10}$ to $1 \times 10^{11}$ cm$^{-3}$, and a self-bias electric voltage of an electrode is not higher than 300 V.

According to the present invention, since the plasma is formed under a condition wherein the pressure in the chamber is 1.33 to 13.3 Pa, the plasma density in the chamber is $5 \times 10^{10}$ to $1 \times 10^{11}$ cm$^{-3}$, and the self-bias electric voltage of an electrode is not higher than 300 V, the organic-material film can be etched with a high etching rate while a micro-trenching phenomenon can be inhibited.

In addition, the present invention is a plasma etching method comprising: an arranging step of arranging a pair of electrodes oppositely in a chamber and making one of the electrodes support a substrate to be processed in such a manner that the substrate is arranged between the electrodes, the substrate having an organic-material film; and an etching step of applying a high-frequency electric power to at least one of the electrodes to form a high-frequency electric field between the pair of the electrodes, supplying a process gas into the chamber to form a plasma of the process gas by means of the electric field, and plasma-etching the organic-material film of the substrate by means of the plasma partway in order to form a groove having a flat bottom; wherein in the etching step, a pressure in the chamber is 53 to 133 Pa, plasma density in the chamber is $1 \times 10^{11}$ to $2 \times 10^{11}$ cm$^{-3}$, and a self-bias electric voltage of an electrode is not higher than 600 V.

According to the present invention, since the plasma is formed under a condition wherein the pressure in the chamber is 53 to 133 Pa, the plasma density in the chamber is $1 \times 10^{11}$ to $2 \times 10^{11}$ cm$^{-3}$, and the self-bias electric voltage of an electrode is not higher than 600 V, the organic-material film can be etched with a high etching rate while a micro-trenching phenomenon can be inhibited.

In the above explanation, for example, the process gas comprises at least one selected from an $N_2$ gas, an $H_2$ gas, an $O_2$ gas, a CO gas, an $NH_3$ gas, a $C_xH_y$ gas (x, y are natural numbers) and a rare gas.

In addition, the organic-material film may include O, C and H. Alternatively, the organic-material film may include Si, O, C and H. Typically, the organic-material film is a low-dielectric-constant film (low-k film).

A micro-trenching phenomenon tends to be caused more easily when a width of the groove is larger. Thus, the present invention is more effective when the flat bottom has a width not less than 0.5 μm.

Herein, because of the Paschen's law, an electric-discharge starting voltage Vs takes a local minimum value (Paschen's minimum value) when a product pd of a gas pressure p and a distance d between the electrodes takes a certain value. The certain value of the product pd that corresponds to the Paschen's minimum value is smaller when the frequency of the high-frequency electric power is higher. Thus, when the frequency of the high-frequency electric power is high, in order to decrease the electric-discharge starting voltage Vs to facilitate and stabilize the electric-discharge effect, the distance d between the electrodes has to be reduced, if the gas pressure p is constant. Thus, in the present invention, it is preferable that the distance between the electrodes is shorter than 50 mm. In addition, when the distance between the electrodes is shorter than 50 mm, residence time of the gas in the chamber can be shortened. Thus, reaction products can be efficiently discharged, and etching stop can be reduced.

BRIEF DESCRIPTION OF THE DRAWINGS

FIG. 1 is a schematic vertical sectional view showing a plasma etching unit of an embodiment according to the present invention;

FIGS. 5A and 5B are explanatory views of etching states according to a plasma etching process of the present invention;

FIG. 15A is a sectional view showing another structural example of wafer to which a plasma etching process according to the present invention is applied; and FIG. 15B is an explanatory view of an etching state of the structural example of wafer shown in FIG. 15A.

DESCRIPTION OF THE PREFERRED EMBODIMENT

Figure 2:
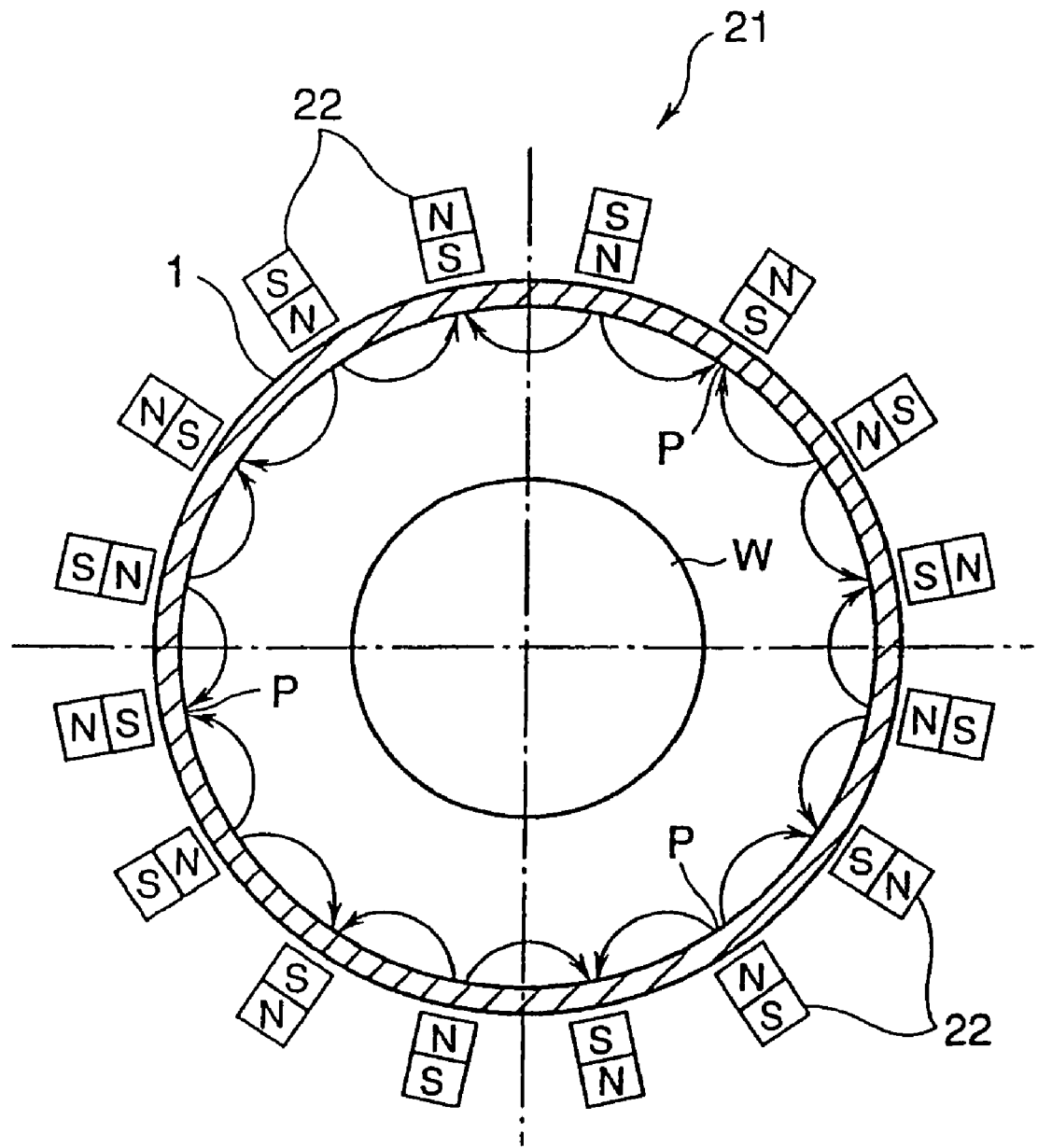
FIG. 2 is a horizontal sectional view schematically showing a magnetic annular unit arranged around a chamber of the plasma etching unit of FIG. 1.

An embodiment of the invention will now be described with reference to the attached drawings.

FIG. 1 is a schematic sectional view showing a plasma etching unit used for carrying out the present invention. The etching unit of the embodiment includes a two-stage cylindrical chamber vessel 1, which has an upper portion 1a having a small diameter and an lower portion 1b having a large diameter. The chamber vessel 1 may be hermetically made of any material, for example aluminum.

A supporting table 2 is arranged in the chamber vessel 1 for horizontally supporting a wafer W as a substrate to be processed. The supporting table 2 may be made of any material, for example aluminum. The supporting table 2 is placed on a conductive supporting stage 4 via an insulation plate 3. A focus ring 5 is arranged on a peripheral area of the supporting table 2. The focus ring 5 may be made of any conductive material or any insulating material. When the diameter of the wafer W is 200 mmφ, it is preferable that the focus ring 5 is 240 to 280 mmφ. The supporting table 2, the insulation plate 3, the supporting stage 4 and the focus ring 5 can be elevated by a ball-screw mechanism including a ball-screw 7. A driving portion for the elevation is arranged below the supporting stage 4 and is covered by a bellows 8. The bellows 8 may be made of any material, for example stainless steel (SUS). The chamber vessel 1 is earthed. A coolant passage (not shown) is formed in the supporting table 2 in order to cool the supporting table 2. A bellows cover 9 is provided around the bellows 8.

A feeding cable 12 for supplying a high-frequency electric power is connected to a substantially central portion of the supporting table 2. The feeding cable 12 is connected to a high-frequency electric power source 10 via a matching box 11. A high-frequency electric power of a predetermined frequency is adapted to be supplied from the high-frequency electric power source 10 to the supporting table 2. A showerhead 16 is provided above the supporting table 2 and oppositely in parallel with the supporting table 2. The showerhead 16 is also earthed. Thus, the supporting table 2 functions as a lower electrode, and the showerhead 16 functions as an upper electrode. That is, the supporting table 2 and the showerhead 16 form a pair of plate electrodes.

Herein, it is preferable that the distance between the electrodes is set to be shorter than 50 mm. The reason is as follows.

Because of the Paschen's law, an electric-discharge starting voltage Vs takes a local minimum value (Paschen's minimum value) when a product pd of a gas pressure p and a distance d between the electrodes takes a certain value. The certain value of the product pd that corresponds to the Paschen's minimum value is smaller when the frequency of the high-frequency electric power is higher. Thus, when the frequency of the high-frequency electric power is high like the present embodiment, in order to decrease the electric-discharge starting voltage Vs to facilitate and stabilize the electric-discharge effect, the distance d between the electrodes has to be reduced, if the gas pressure p is constant. Thus, it is preferable that the distance between the electrodes is shorter than 50 mm. In addition, when the distance between the electrodes is shorter than 50 mm, residence time of the gas in the chamber can be shortened. Thus, reaction products can be efficiently discharged, and etching stop can be reduced.

However, if the distance between the electrodes is too short, pressure distribution on the surface of the wafer W as a substrate to be processed (pressure difference between in a central portion and in a peripheral portion) may become large. In the case, problems such as deterioration of etching uniformity may be generated. Independently on gas flow rate, in order to make the pressure difference smaller than 0.27 Pa (2 mTorr), it is preferable that the distance between the electrodes is not shorter than 35 mm.

An electrostatic chuck 6 is provided on an upper surface of the supporting table 2 in order to electrostaticly stick to the wafer W. The electrostatic chuck 6 consists of an insulation plate 6b and an electrode 6a inserted in the insulation plate 6b. The electrode 6a is connected to a direct-current power source 13. Thus, when the direct-current power source 13 supplies an electric power to the electrode 6a, the semiconductor wafer W may be stuck to the electrostatic chuck 6 by coulomb force, for example.

The coolant passage not shown is formed in the supporting table 2. The wafer W can be controlled at a predetermined temperature by circulating a suitable coolant in the coolant passage. In order to efficiently transmit heat of cooling from the suitable coolant to the wafer W, a gas-introducing mechanism (not shown) for supplying a He gas onto a reverse surface of the wafer W is provided. In addition, a baffle plate 14 is provided at an outside area of the focus ring 5. The baffle plate 14 is electrically connected to the chamber vessel 1 via the supporting stage 4 and the bellows 8.

The showerhead 16 facing the supporting table 2 is provided in a ceiling of the chamber vessel 1. The showerhead 16 has a large number of gas jetting holes 18 at a lower surface thereof and a gas introducing portion 16a at an upper portion thereof. Then, an inside space 17 is formed between the gas introducing portion 16a and the large number of gas jetting holes 18. The gas introducing portion 16a is connected to a gas supplying pipe 15a. The gas supplying pipe 15a is connected to a process-gas supplying system 15, which can supply a process gas for conducting an etching process. As the process gas, any gas generally used in this technical field may be used, preferably at least one of an $N_2$ gas, an $H_2$ gas, an $O_2$ gas, a CO gas, an $NH_3$ gas, a $C_xH_y$ gas (x and y are natural numbers) and a rare gas may be used.

The process gas is supplied from the process-gas supplying system 15 into the space 17 of the showerhead 16 through the gas supplying pipe 15a and the gas introducing portion 16a. Then, the process gas is jetted from the gas jetting holes 18 in order to etch a film formed on the wafer W.

A discharging port 19 is formed at a part of a side wall of the lower portion 1b of the chamber 1. The discharging port 19 is connected to a gas-discharging system 20 including a vacuum pump. A pressure of an inside of the chamber vessel 1 may be reduced to a predetermined vacuum level by operating the vacuum pump. A transferring port for the wafer W and a gate valve 24 for opening and closing the transferring port are arranged at another upper part of the side wall of the lower portion 1b of the chamber vessel 1.

A magnetic annular unit 21 is concentrically arranged around the upper portion 1a of the chamber vessel 1. Thus, a magnetic field may be formed around a processing space between the supporting table 2 and the showerhead 16. The magnetic annular unit 21 may be caused to revolve around a center axis thereof (along an annular peripheral edge thereof) by a revolving mechanism 25.

The magnetic annular unit 21 has a plurality of segment magnets 22 which are supported by a holder not shown and which are arranged annularly. Each of the plurality of segment magnets 22 consists of a permanent magnet. In the embodiment, 16 segment magnets 22 are arranged annularly (concentrically) in a multi-pole state. That is, in the magnetic annular unit 21, adjacent two segment magnets 22 are arranged in such a manner that their magnetic-pole directions are opposite. Thus, a magnetic line of force is formed between the adjacent two segment magnets 22 as shown in FIG. 2, so that a magnetic field of 0.02 to 0.2 T (200 to 2000 Gauss), preferably 0.03 to 0.045 T (300 to 450 Gauss), is generated only around the processing space. On the other hand, in a region wherein the wafer is placed, a substantially non-magnetic field state is generated. The above strength of the magnetic field is determined because of the following reasons: if the magnetic field is too strong, a fringing field may be caused; and if the magnetic field is too weak, plasma confining effect can not be achieved. Of course, the suitable strength of the magnetic field also depends on the unit structure or the like. That is, the range of the suitable strength of the magnetic field may be different for respective units.

When the above magnetic field is formed around the processing space, strength of the magnetic field on the focus ring 5 is desirably not lower than 0.001 T (10 Gauss). In the case, drift movement of electrons (E×B drift) is generated on the focus ring, so that the plasma density around the wafer is increased, and hence the plasma density is made uniform. On the other hand, in view of preventing charge-up damage of the wafer W, strength of the magnetic field in a portion where the wafer W is positioned is desirably not higher than 0.001 T (10 Gauss).

Herein, the substantially non-magnetic state in a region occupied by the wafer means a state that there is not a magnetic field affecting the etching process in the area occupied by the wafer. That is, the substantially non-magnetic state includes a state that there is a magnetic field not substantially affecting the wafer process.

In the state shown in FIG. 2, a magnetic field whose density is not more than 0.42 mT (4.2 Gauss) is applied to a peripheral area of the wafer. Thus, plasma confining function can be achieved.

When a magnetic field is formed by the magnetic annular unit of the multi-pole state, wall portions of the chamber 1 corresponding to the magnetic poles (for example, portions shown by P in FIG. 2) may be locally whittled. Thus, the magnetic annular unit 21 may be caused to revolve along the peripheral direction of the chamber by the above revolving mechanism 25. Thus, it is avoided that the magnetic poles are locally abutted (located) against the chamber wall, so that it is prevented that the chamber wall is locally whittled.

Each segment magnet 22 is configured to freely revolve around a perpendicular axis thereof by a segment-magnet revolving mechanism not shown. Then, when the segment magnets 22 are caused to revolve, the state wherein the multi-pole magnetic field is substantially formed and the state wherein the multi-pole magnetic field is not formed can be switched. Depending on a process condition, the multi-pole magnetic field may be effective on the wafer process or not. Thus, when the state wherein the multi-pole magnetic field is formed and the state wherein the multi-pole magnetic field is not formed can be switched, a suitable state can be selected correspondingly to the process condition.

As the state of the magnetic field is changed depending on the arrangement of the segment magnets, when the arrangement of the segment magnets is changed variously, various profiles of magnetic field can be formed. Thus, it is preferable to arrange the segment magnets so as to obtain a required profile of magnetic field.

The number of the segment magnets is not limited to the above examples. The section of each segment magnet is not limited to the rectangle, but may have any shape such as a circle, a square, a trapezoid or the like. A magnetic material forming the segment magnets 22 is also not limited, but may be any known magnetic material such as a rare-earth magnetic material, ferrite magnetic material, an Arnico magnetic material, or the like.

Figure 3:
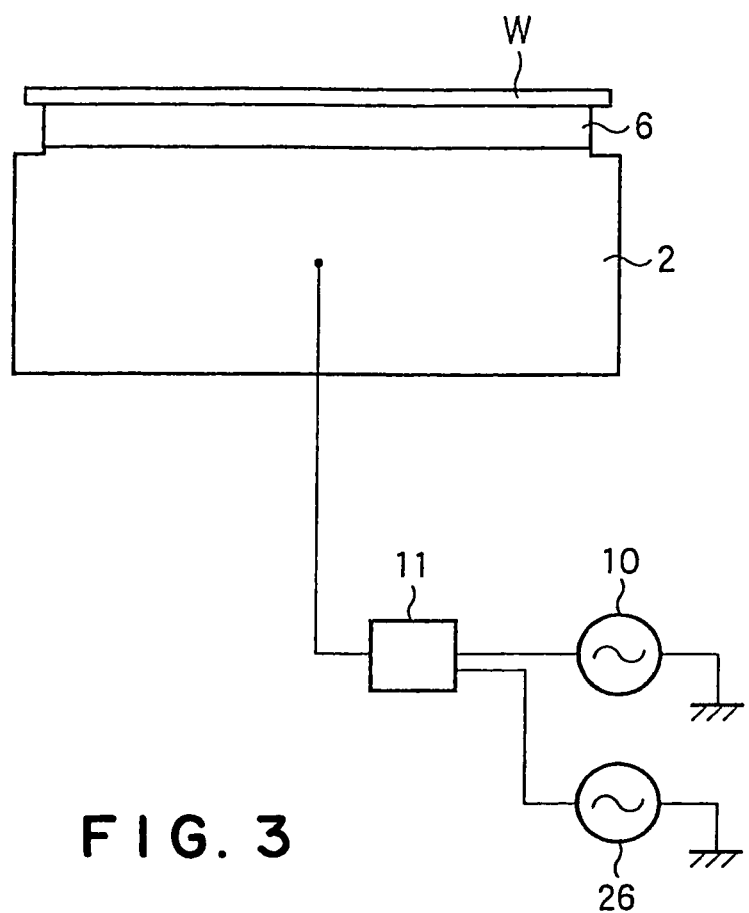
FIG. 3 is a schematic sectional view partly showing a plasma processing unit comprising a high-frequency electric power source for generating plasma and a high-frequency electric power source for drawing ions.

In order to adjust plasma density and ion-drawing effect, the high-frequency electric power for generating plasma and a second high-frequency electric power for drawing ions may be overlapped with each other. Specifically, as shown in FIG. 3, in addition to the high-frequency electric power source 10 for generating plasma, a second high-frequency electric power source 26 for drawing ions is connected to the matching box 11, so that they are overlapped. In the case, the frequency of the second high-frequency electric power source 26 for drawing ions is preferably 500 kHz to 27 MHz. Thus, ion energy can be controlled so that an etching rate of the organic-material film can be raised more.

Next, an operation for etching a low-dielectric-constant film (low-k film) as an organic-material film by using the above plasma etching unit is explained.

Figure 4:
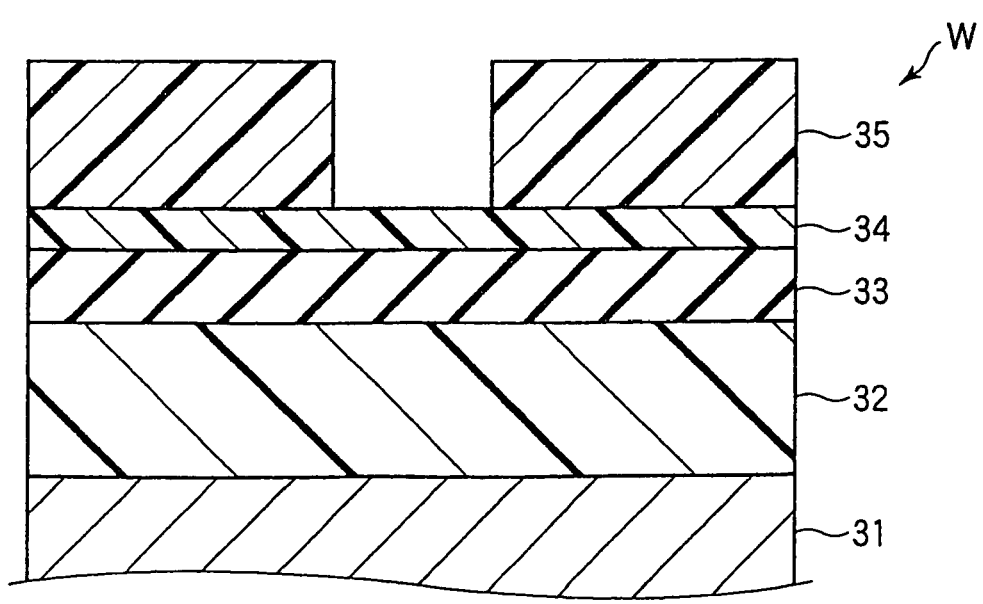
FIG. 4 is a sectional view showing a structural example of wafer to which a plasma etching process according to the present invention is applied.

In the case, in a wafer W before being etched, as shown in FIG. 4, an organic-material film 32 that is a low-k film is formed as an interlayer dielectric film on a silicon substrate 31. Then, an inorganic-material film 33 is formed as a hard mask on the organic-material film 32. Thereon, a BARC layer 34 is formed. Then, a resist film 35 having a predetermined pattern is formed thereon.

The inorganic-material film 33 consists of a material generally used as a hard mask. As a suitable example, it may be a silicon oxide, a silicon nitride, a silicon oxinitride, or the like.

The organic-material film 32 to be etched is typically a low-k film used as an interlayer dielectric film, as described above. Thus, the dielectric constant of the organic-material film 32 is much smaller than that of a silicon oxide which is a conventional material for an interlayer dielectric film. The low-k film of the organic-material consists of, for example, a polyorganosiloxane-bridge bisbenzocyclobutene resin (BCB), a polyaryleneether resin (PAE) such as SiLK (commercial name) and FLARE (commercial name) made by DowChemical Company, an organic polysiloxane resin such as methylsilsesquioxane (MSQ), or the like. Herein, the organic polysiloxane means a material having a structure wherein a functional group including C, H is included in a bonding-structure of a silicon oxide film, as shown below. In the structure shown below, R means an alkyl group such as a methyl group, an ethyl group, a propyl group or the like; or a derivative thereof; or an aryl group such as a phenyl group: or a derivative thereof.

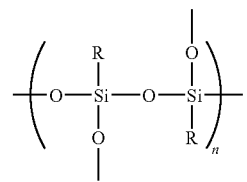

In the wafer W of the above structure, the BARC layer 34 and the inorganic-material film 33 are etched while the resist film 35 is used as a mask. The state is shown in FIG. 5A. In the step, the thickness of the resist film 35 is reduced by the etching.

Then, the organic-material film 32 is trench-etched while the resist film 35 and the inorganic-material film 33 are used as a mask. At first, the gate valve 24 of the unit of FIG. 1 is opened, a wafer W of the structure shown in FIG. 5A is conveyed into the chamber 1 by means of a conveying arm, and placed on the supporting table 2. After that, the conveying arm is evacuated, the gate valve 24 is closed, and the supporting table 2 is moved up to a position shown in FIG. 1. The vacuum pump of the gas-discharging system 20 creates a predetermined vacuum in the chamber 1 through the discharging port 19.

Then, a predetermined process gas, for example an $N_2$ gas and an $O_2$ gas, is introduced into the chamber 1 through the process-gas supplying system 15, for example at a flow rate of 0.1 to 1 L/min (100 to 1000 sccm). Thus, a pressure in the chamber 1 is maintained at a predetermined pressure, for example not higher than 133 Pa (1000 mTorr). In this state, a high-frequency electric power whose frequency is 50 to 150 MHz is supplied from the high-frequency electric power source 10 to the supporting table 2. In this case, power per unit area is preferably within a range of about 0.5 to about 10 $W/cm^2$. Then, a predetermined electric voltage is applied from the direct current power source 13 to the electrode 6a of the electrostatic chuck 6, so that the wafer W sticks to the electrostatic chuck 6 by means of Coulomb force, for example.

When the high-frequency electric power is applied to the supporting table 2 as the lower electrode as described above, a high-frequency electric field is formed in the processing space between the showerhead 16 as the upper electrode and the supporting table 2 as the lower electrode. Thus, the process gas supplied into the processing space is made plasma, which etches the organic-material film 32.

During the etching step, by means of the annular magnetic unit 21 of a multi-pole state, a magnetic field as shown in FIG. 2 can be formed around the processing space. In the case, plasma confining effect is achieved, so that an etching rate of the wafer W may be made uniform, even in a case of a high frequency like this embodiment wherein the plasma tends to be not uniform. However, depending on the kind of the film, the magnetic field may not have an effect. In the case, the segment magnets may be caused to revolve in order to conduct the etching process under a condition wherein a magnetic field is substantially not formed around the processing space.

When the above magnetic field is formed, by means of the electrically conductive or insulating focus ring 5 provided around the wafer W on the supporting table 2, the effect of making the plasma process uniform can be more enhanced. That is, if a plasma density at a peripheral portion of the wafer is high and an etching rate at the peripheral portion of the wafer is larger than that at a central portion of the wafer, by using a focus ring made of an electrically conductive material such as silicon or SiC, even a focus-ring region functions as the lower electrode. Thus, a plasma-forming region is expanded over the focus ring 5, the plasma process around the wafer W is promoted, so that uniformity of the etching rate is improved. In addition, if a plasma density at the peripheral portion of the wafer is low and an etching rate at the peripheral portion of the wafer is smaller than that at the central portion of the wafer, by using a focus ring made of an electrically insulating material such as quartz, electric charges can not be transferred between the focus ring 5 and electrons and ions in the plasma. Thus, the plasma confining effect may be increased so that uniformity of the etching rate is improved.

In addition, if necessary, the high-frequency electric power of 500 kHz to 27 MHz is applied from the high-frequency electric power source 26 for drawing ions, shown in FIG. 3, to the supporting table 2 in order to control the ion energy to raise the etching rate of the organic-material film 32.

Figure 6:
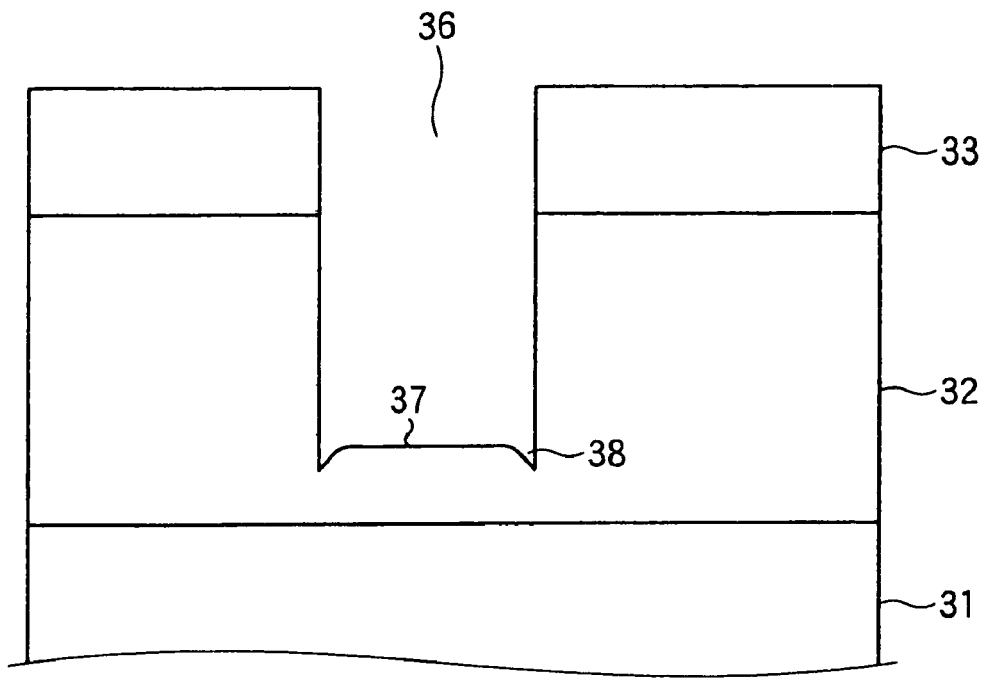
FIG. 6 is a schematic view for explaining a micro-trenching phenomenon.

In the embodiment, as shown in FIG. 5B, when a trench 36 is formed, the etching process is stopped partway along the depth of the organic-material film 32 so that a flat portion 37 is formed at a bottom of the trench 36. In the case, if the ion energy in the vertical direction is large, as shown in FIG. 6, a micro trench 38 that is a micro groove extending further downward may be generated at an edge portion of the flat portion 37. The micro trench may cause insufficient filling and/or concentration of electric charges. Thus, it is necessary not to generate the micro trench as much as possible. Therefore, in the embodiment, in order to make difficult generation of a micro trench, the frequency of the high-frequency electric power supplied from the high-frequency electric power source 10 to the supporting table 2 is set at 50 to 150 MHz.

The reason is explained as follows.

According to a result of study by the inventors, in the etching process of the organic-material film, plasma density is dominant, and ion energy contributes only a little. On the other hand, a micro-trenching phenomenon may be caused when the ion energy is large in a perpendicular direction. Thus, when the organic-material film 32 is trench-etched, in order to inhibit the micro-trenching phenomenon and in order to raise an etching rate of the organic-material film 32, the plasma density has to be high and the ion energy has to be low in the etching condition. In the case, the ion energy of the plasma indirectly corresponds to a self-bias electric voltage of an electrode at the etching process. Thus, both in order to inhibit the micro-trenching phenomenon and in order to etch the organic-material film 32 with a high etching rate, finally, it is necessary to etch the organic-material film 32 under a condition of high plasma density and low bias. Then, as clearly seen from FIG. 7, which is explained below, when the frequency of the high-frequency electric power is higher than prior art, the etching process can be achieved under a condition of high plasma density and low bias.

Figure 7:
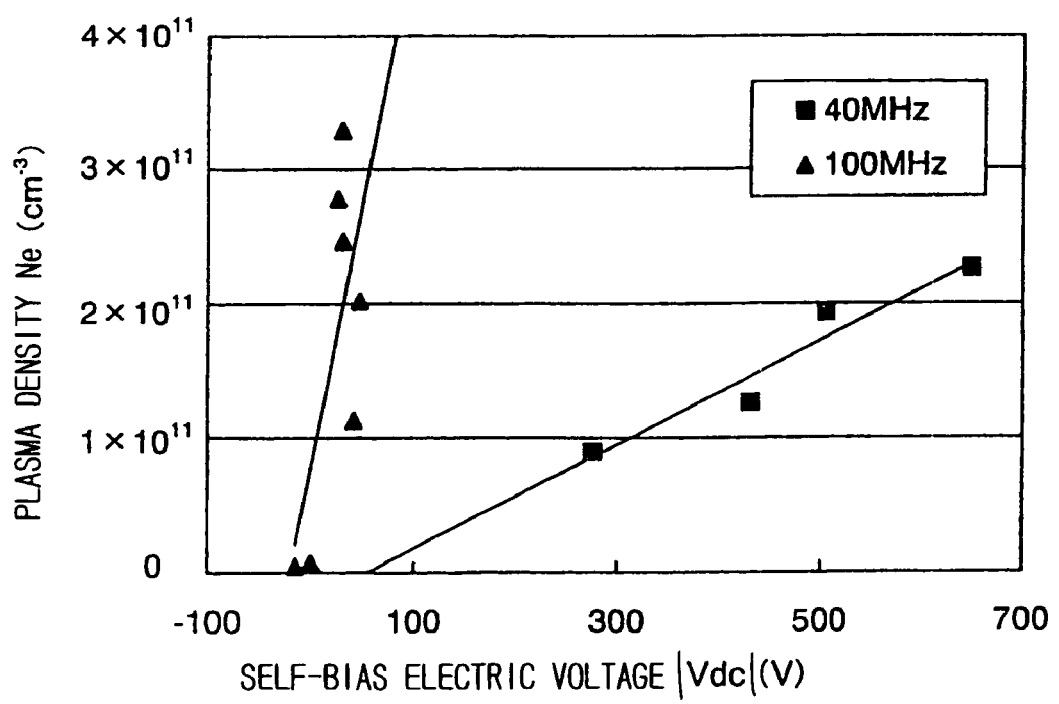
FIG. 7 is a graph showing relationships between the absolute value of a self-bias electric voltage |Vdc| and plasma density Ne, in respective cases wherein the frequency of the high-frequency electric power is 40 MHz or 100 MHz, when the plasma consists of argon gas.

FIG. 7 is a graph showing relationships between the absolute value of a self-bias electric voltage |Vdc| and plasma density Ne, in respective cases wherein the frequency of the high-frequency electric power is 40 MHz or 100 MHz. The transverse axis represents the absolute value of a self-bias electric voltage |Vdc|, and the ordinate axis represents the plasma density Ne. In the case, as the plasma gas, Ar was used for evaluation, instead of real etching gas. For each frequency, applied high-frequency electric power was changed, so that values of the plasma density Ne and the self-bias electric voltage |Vdc| were changed. That is, in the respective frequencies, if the applied high-frequency electric power is large, both the plasma density Ne and the self-bias electric voltage |Vdc| are large. Herein, the plasma density was measured by means of a microwave interferometer.

As shown in FIG. 7, in the case wherein the frequency of the high-frequency electric power is conventionally 40 MHz, when the plasma density is increased to enhance the etching rate of the organic-material film, the self-bias electric voltage |Vdc| is greatly increased, so that it is difficult to achieve high plasma density and low self-bias electric voltage. On the other hand, in the case wherein the frequency of the high-frequency electric power is 100 MHz that is higher than prior art, even when the plasma density is increased, the self-bias electric voltage Vdc is not so increased and controlled substantially not higher than 100 V. That is, it was found that a condition of high plasma density and low self-bias electric voltage can be achieved.

Based on the above result, the frequency of the high-frequency electric power supplied from the high-frequency electric power source 10 to the supporting table 2 is set not less than 50 MHz, which is higher than prior art. However, if the frequency of the high-frequency electric power for generating plasma is higher than 150 MHz, the uniformity of the plasma may be deteriorated. Thus, it is preferable that the frequency of the high-frequency electric power for generating plasma is not higher than 150 MHz. In particular, in order to effectively achieve the above effect, it is preferable that the frequency of the high-frequency electric power for generating plasma is 70 to 100 MHz.

In the case, as described above, when the second high-frequency electric power of 500 kHz to 27 MHz from the high-frequency electric power source 26 is overlapped with the high-frequency electric power in order to raise the etching rate more, the micro-trenching phenomenon may be caused more easily because of ion drawing effect thereof. This problem can be solved by increasing the pressure in the chamber 1 to 53 Pa or more. Thus, ions may collide with each other and then may be diffused, so that the micro-trenching phenomenon can be effectively inhibited. However, if the pressure in the chamber 1 is larger than 133 Pa, a CD shift is increased. Thus, in order to obtain a high etching rate by overlapping the second high-frequency electric power from the high-frequency electric power source 26, in order to inhibit the micro-trenching phenomenon effectively, and in order to maintain the CD shift within a desired range, it is preferable that the pressure in the chamber is 53 to 133 Pa. Of course, even if the second high-frequency electric power from the high-frequency electric power source 26 is not overlapped, when the pressure in the chamber 1 is set not lower than 53 Pa, the micro-trenching phenomenon can be inhibited more effectively.

In addition, it is preferable that a residence time of the process gas in the chamber in the etching step is 70 to 180 msec. This time range substantially corresponds to the above pressure range. Herein, the residence time is defined with respect to a portion in the chamber contributing to the etching process. Specifically, when V (m$^3$) represents an effective chamber volume obtained by multiplying an area of the wafer W and a distance between the electrodes together (since the gas outside the wafer doesn't contribute to the etching process, the volume of the portion including the gas contributing to the etching process is used), S (m$^3$/sec) represents an exhaust velocity, p (Pa) represents a pressure in the chamber, and Q (Pa*m$^3$/sec) represents a total flow rate, the residence time τ can be obtained according to the following expression.

$$\tau = V/S = pV/Q \text{(sec)}$$

Herein, the above micro-trenching phenomenon tends to be caused more easily when a width of the flat portion 37 of the trench 36 is 0.5 μm. Thus, the present invention is more effective when the flat portion 37 has a width not less than 0.5 μm.

Next, an experimental result is explained, wherein a trench was actually formed in an organic-material film.

Herein, the unit shown in FIG. 1 was used. As the wafer W, a 300 mm wafer was used. As the etching gas, an N$_2$ gas and an H$_2$ gas were used. The gap between the electrodes was 40 mm. A high-frequency electric power of 100 MHz and a second high-frequency electric power of 3.2 MHz were overlapped and applied. The total power of the high-frequency electric powers was 2400 W, and the power of the second high-frequency electric power of 3.2 MHz was 800 W, so that the etching rate was enhanced. Then, the pressure in the chamber was changed among 13.3 Pa (100 mTorr), 60 Pa (450 mTorr) and 106.5 Pa (800 mTorr). Trenching processes were conducted under the respective pressure conditions. In the case of 13.3 Pa, gas flow rates were N$_2$ gas: 0.5 L/min and H$_2$ gas: 0.5 L/min. In the cases of 60 Pa and 106.5 Pa, gas flow rates were N$_2$ gas: 0.65 L/min and H$_2$ gas: 0.65 L/min. The residence times were respectively 22.3 msec, 77.3 msec and 137.5 msec for the pressures 13.3 Pa, 60 Pa and 106.5 Pa. The used wafer W had the same structure as shown in FIG. 4. That is, a SiLK (commercial name) had been formed on a silicon substrate as the organic-material film 32, an SiO$_2$ film for serving as a hard mask had been formed on the SiLK as the inorganic-material film 33, and the BARC layer 34 and the resist film 35 had been formed on the SiO$_2$ film.

After the BARC layer 34 and the inorganic-material film 33 were etched by using the resist film 35 as a mask, trenching processes were conducted under the above respective conditions. After that, for each pressure condition, an etching rate of the SiLK, a micro-trenching index and a CD shift were measured.

Figure 8:
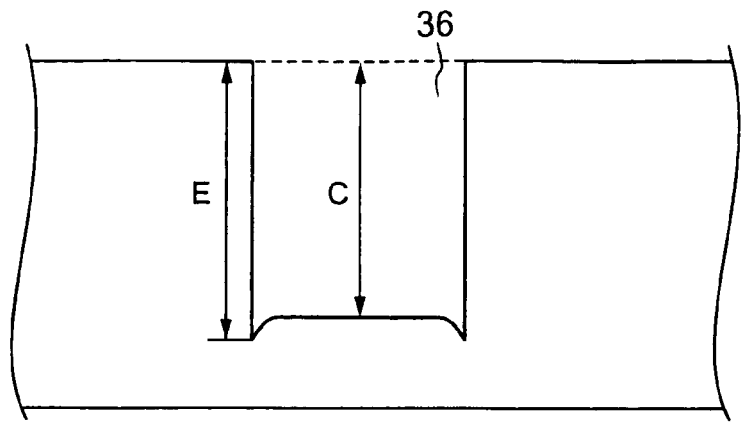
FIG. 8 is a schematic view for explaining a micro-trenching index.

As shown in FIG. 8, the micro-trenching index is C/E×100 (%) wherein E represents a depth at an edge of a trench having a width of 0.5 μm and C represents a depth at a center of the trench. If the micro-trenching index is near to 100%, there is little micro-trenching phenomenon and the etching state is good. In detail, if the micro-trenching index is not less than 90%, the etching state is good.

The CD shift means a value showing how much a top seen from over the hard mask (SiO$_2$ film) is shifted from the trench width (herein, 0.25 μm) through the etching process. If the top is shifted smaller, the CD shift has a minus value, and if the top is shifted larger, the CD shift has a plus value. If the absolute value of the CD shift is small, the etching state is good. In detail, if the absolute value of the CD shift is not larger than 10 nm, the etching state is good.

Figure 9:
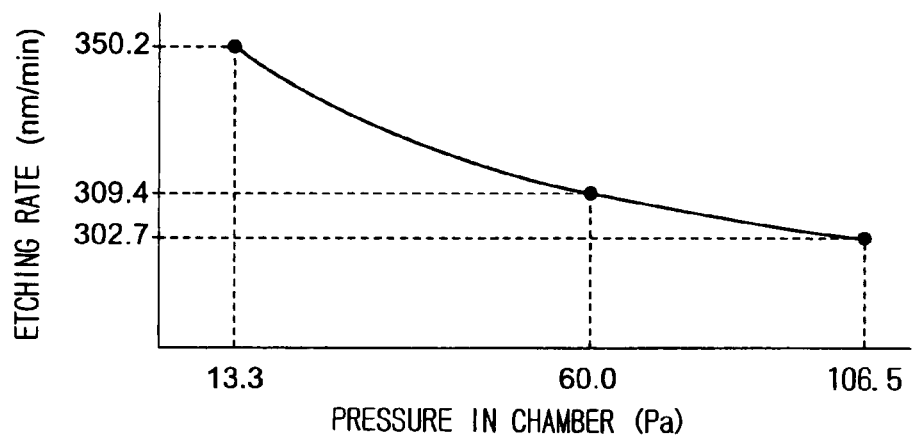
FIG. 9 is a graph showing relationships between a pressure in the chamber and an etching rate.
Figure 10:
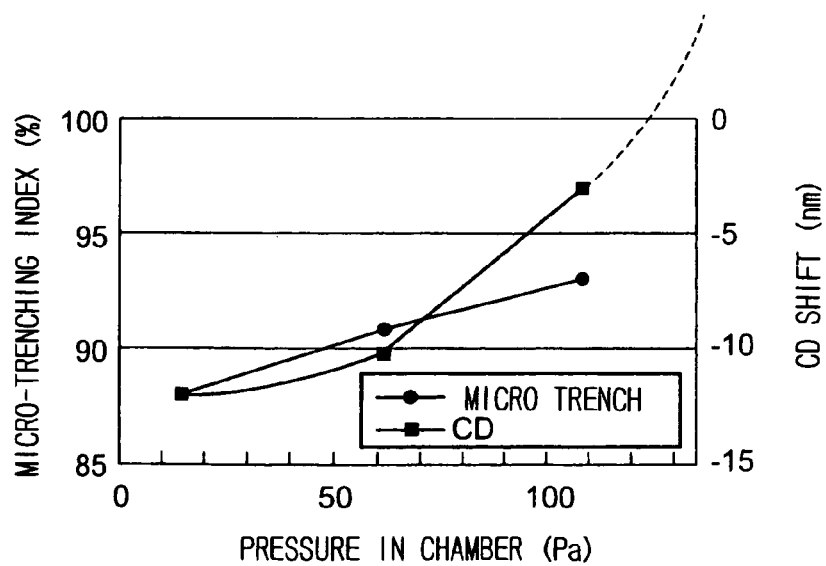
FIG. 10 is a graph showing relationships between a pressure in the chamber and a micro-trenching index and relationships between a pressure in the chamber and a CD shift.

The experimental result is shown in FIGS. 9 and 10. As seen from FIG. 9, when the pressure in the chamber is increased, the etching rate is reduced.

On the other hand, as shown in FIG. 10, when the pressure in the chamber is increased, the micro-trenching index is also increased. In addition, when the pressure in the chamber is 13.3 Pa (100 mTorr), the micro-trenching index is 88%, which is lower than preferable 90%. However, when the pressure in the chamber is 60 Pa (450 mTorr), the micro-trenching index is 91% (>90%), and when the pressure in the chamber is 106.5 Pa (800 mTorr), the micro-trenching index is 93% (>90%). Thus, it was confirmed that when the pressure in the chamber is not less than 53 Pa (400 mTorr), it is difficult for the micro-trenching phenomenon to be caused.

In addition, as shown in FIG. 10, when the pressure in the chamber is increased, the absolute value of the CD shift tends to be smaller. On the other hand, when the pressure in the chamber is larger than 133 Pa (1000 mTorr), it is thought that the CD shift has a large plus value. Thus, is was confirmed that the pressure in the chamber is preferably about 53 to about 133 Pa (about 400 to about 1000 mTorr) when the high-frequency electric power of 3.2 MHz is overlapped in order to enhance the etching rate. At that time, the residence time is about 70 to about 180 msec. In addition, it was confirmed that the micro-trenching index is higher in the case of 100 MHz than in the case of less than 50 MHz, whose detail's explanation is omitted.

Next, another experimental result is explained, wherein a trench was actually formed in an organic-material film.

Herein, the unit shown in FIG. 1 was used. As the wafer W, a 300 mm wafer was used. As the etching gas, an NH$_3$ gas was used. The gap between the electrodes was 20 mm. A high-frequency electric power of 100 MHz and a second high-frequency electric power of 3.2 MHz were overlapped and applied.

Before explaining the experimental result, characteristics with respect to changes of the respective parameters in the above conditions are explained with reference to FIGS. 11 to 14.

Figure 11:
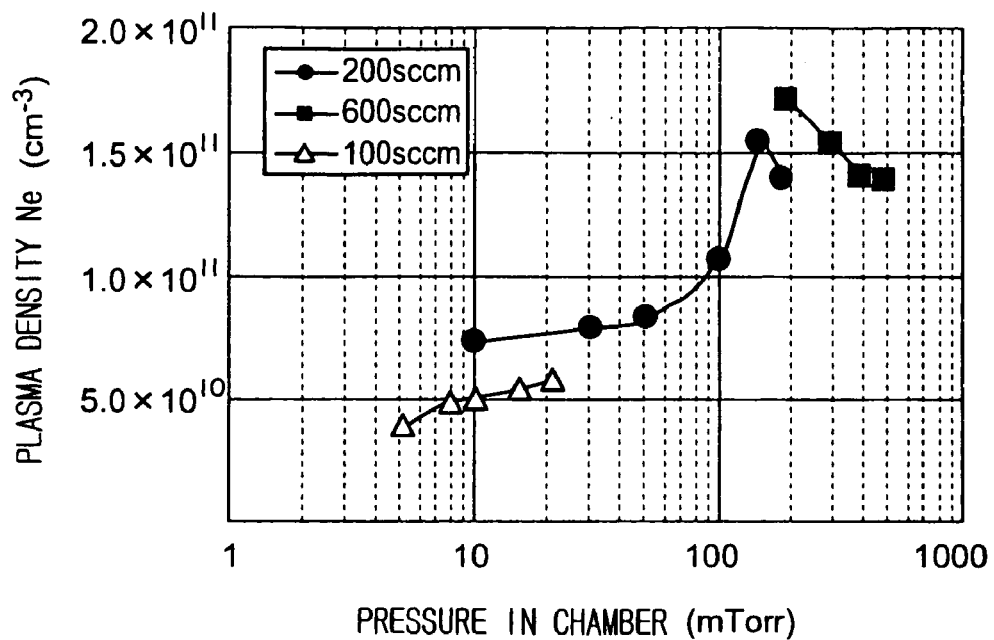
FIG. 11 is a graph showing relationships between a pressure in the chamber and plasma density Ne, when the plasma consists of an $NH_3$ gas.
Figure 12:
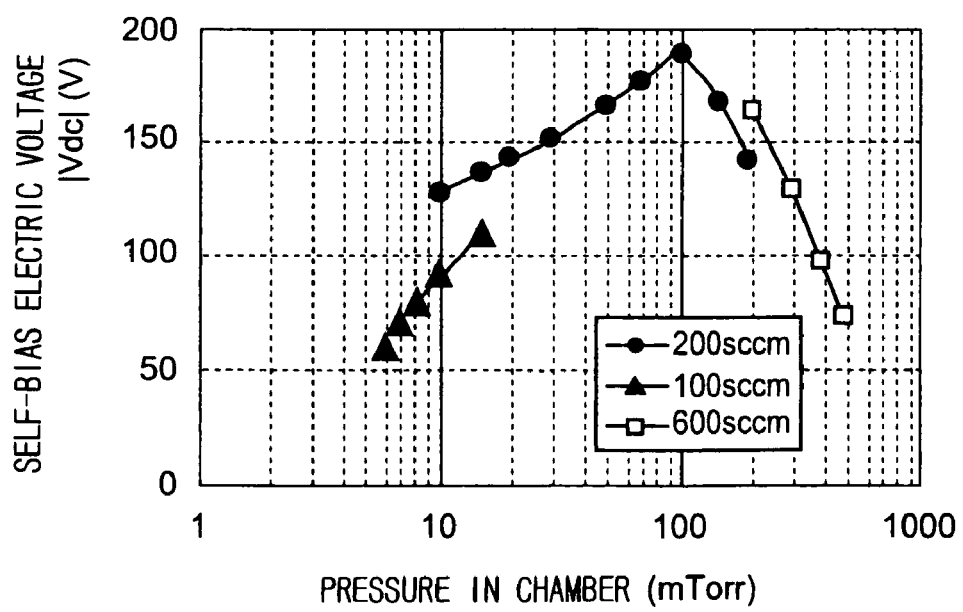
FIG. 12 is a graph showing relationships between a pressure in the chamber and the absolute value of a self-bias electric voltage |Vdc|, when the plasma consists of an $NH_3$ gas.

FIG. 11 is a graph showing relationships between a pressure in the chamber and plasma density Ne, in the above conditions. FIG. 12 is a graph showing relationships between a pressure in the chamber and the absolute value of a self-bias electric voltage |Vdc|, in the above conditions. Plotted data shown in FIGS. 11 and 12 correspond to a pressure condition wherein the gas flow rate is 100 sccm and the pressure in the chamber is adjusted in the vicinity of 10 mTorr (1.33 pa), a pressure condition wherein the gas flow rate is 200 sccm and the pressure in the chamber is adjusted within a range of 10 mTorr (1.33 pa) to about 100 mTorr (about 13.3 Pa) and a pressure condition wherein the gas flow rate is 600 sccm and the pressure in the chamber is adjusted not less than 100 mTorr (about 13.3 pa).

For the data of FIGS. 11 and 12, the high-frequency electric power of 3.2 MHz was not overlapped, and the power of the high-frequency electric power of 100 MHz was 2400 W.

Figure 13:
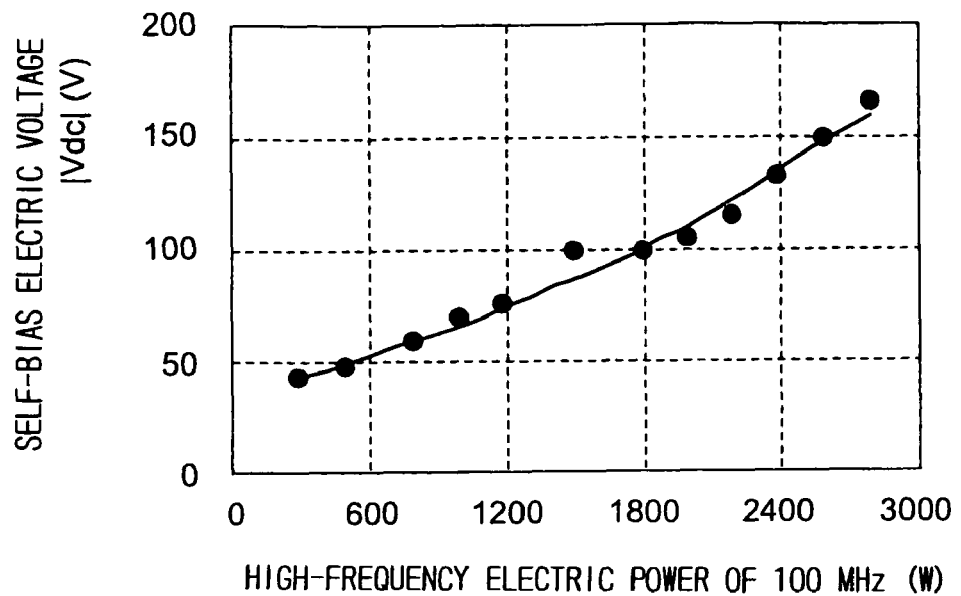
FIG. 13 is a graph showing relationships between power of the high-frequency electric power of 100 MHz and the absolute value of a self-bias electric voltage |Vdc|, when the plasma consists of an $NH_3$ gas and a pressure in the chamber is 30 mTorr.

FIG. 13 is a graph showing relationships between power of the high-frequency electric power of 100 MHz and the absolute value of a self-bias electric voltage |Vdc|, when a pressure in the chamber is 30 mTorr.

Figure 14:
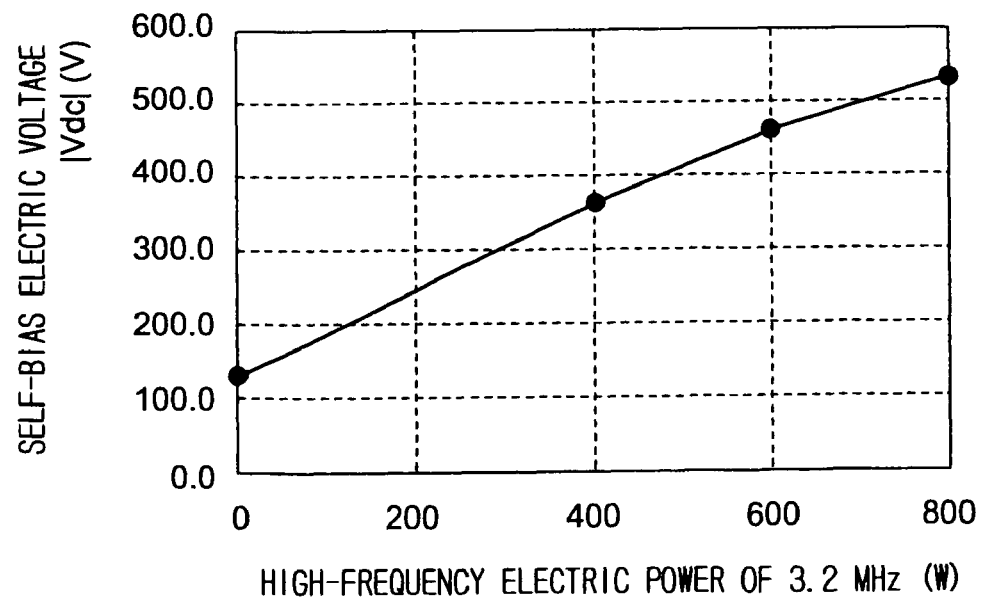
FIG. 14 is a graph showing relationships between power of second high-frequency electric power of 3.2 MHz and the absolute value of a self-bias electric voltage |Vdc|, when the plasma consists of an $NH_3$ gas, a pressure in the chamber is 30 mTorr, the high-frequency electric power of 100 MHz is 2400 W and the second high-frequency electric power of 3.2 MHz is overlapped.

FIG. 14 is a graph showing relationships between power of second high-frequency electric power of 3.2 MHz and the absolute value of a self-bias electric voltage |Vdc|, when a pressure in the chamber is 30 mTorr, the high-frequency electric power of 100 MHz is 2400 W and the second high-frequency electric power of 3.2 MHz is overlapped.

From the characteristics shown in FIGS. 11 to 14, the following information is known.

When a low-pressure range of 10 mTorr (1.33 Pa) to 100 mTorr (13.3 Pa) is used to enhance shape-control characteristics or the like, the ions collide with each other to be diffused to a small extent. Thus, the high-frequency electric power of 3.2 MHz should not be overlapped. In addition, the self-bias electric voltage should be relatively low in order to inhibit the ion energy of the plasma in order to inhibit the micro-trenching phenomenon. In addition, it is preferable that the upper limit of the self-bias electric voltage is about 300 V in order to inhibit a sputtering rate of a silicon oxide film, which serves as a hard mask, within an allowable range. In such conditions, preferably, the power of the high-frequency electric power of 100 MHz is 1000 W (1.42 W/cm$^2$) to 5000 W (7.08 W/cm$^2$) and the corresponding plasma density in the chamber is $5 \times 10^{10}$ to $1 \times 10^{11}$ cm$^{-3}$.

On the other hand, when a high-pressure range of 400 mTorr (53 Pa) to 1000 mTorr (133 Pa) is used to enhance the etching rate or the like, the ions collide with each other to be diffused to a large extent. Thus, overlapping of the high-frequency electric power of 3.2 MHz is allowed to enhance the etching rate more. In addition, the upper limit of the self-bias electric voltage is higher than in the low-pressure condition. It is preferable that the upper limit of the self-bias electric voltage is about 600 V in order to inhibit a sputtering rate of a silicon oxide film, which serves as a hard mask, within an allowable range. In such conditions, preferably, the power of the high-frequency electric power of 100 MHz is 1000 W (1.42 W/cm$^2$) to 5000 W (7.08 W/cm$^2$), the power of the second high-frequency electric power of 3.2 MHz is not higher than 800 W (1.13 W/cm$^2$), and the corresponding plasma density in the chamber is $1 \times 10^{11}$ to $2 \times 10^{11}$ cm$^{-3}$.

The wafer W used for the trench-forming experiment had the same structure as shown in FIG. 4. That is, a SiLK (commercial name) had been formed on a silicon substrate as the organic-material film 32, an SiO$_2$ film for serving as a hard mask had been formed on the SiLK as the inorganic-material film 33, and the BARC layer 34 and the resist film 35 had been formed on the SiO$_2$ film.

After the BARC layer 34 and the inorganic-material film 33 were etched by using the resist film 35 as a mask, a trench was formed. At that time, a pressure in the chamber was 30 mTorr, the second high-frequency electric power of 3.2 MHz was not overlapped, the power of the high-frequency electric power of 100 MHz was 2400 W. The trench was formed into a width of 0.12 μm in a central portion of the wafer W at an etching rate of 209 nm/min. The micro-trenching index was very good.

This invention is not limited to the above embodiments, but may be variously modified. For example, in the above embodiments, a flat groove is formed by a trench-etching process in an organic-material film in which nothing has been formed in advance. However, this invention can be applied to a case wherein a trench 46 having a flat portion 47 as shown in FIG. 15B is formed in an organic-material film 42 in which a hole 41 has been formed in advance for an interlayer wiring to a under layer 43 as shown in FIG. 15A.

In addition, in the above embodiments, as the magnetic-field generating means, the annular magnetic unit in the multi-pole state is used wherein the plurality of segment magnets consisting of permanent magnets are arranged annularly around the chamber. However, the present invention is not limited to this manner if a magnetic-field can be formed around the processing space to confine the plasma. In addition, the peripheral magnetic field for confining the plasma may be unnecessary. That is, the etching process can be conducted under a condition wherein there is no magnetic field. In addition, the present invention can be applied to a plasma etching process conducted in a crossed electromagnetic field wherein a horizontal magnetic field is applied to the processing space.

In addition, in the above embodiments, the high-frequency electric power for generating plasma is applied to the lower electrode, but may be applied to the upper electrode. In the above embodiment, the low-k film is used as the organic-material film, but other films including O, C and H or other films including Si, O, C and H may be also used. In addition, the layer structure of the wafer is not limited to that shown in FIG. 4. In addition, the semiconductor wafer is taken as an example of the substrate to be processed. However, this invention is not limited thereto, but applicable to any plasma-etching process for an organic-material film of an LCD substrate or any other substrate.

The invention claimed is:

1. A plasma etching method comprising an arranging step of arranging a pair of electrodes oppositely in a chamber and making one of the electrodes support a substrate to be processed in such a manner that the substrate is between the electrodes, the substrate having an organic-material film, and an etching step of applying a first high-frequency electric power and a second high-frequency electric power to the electrode made to support the substrate to form a high-frequency electric field between the pair of electrodes, of supplying a process gas into the chamber to form a plasma of the process gas by means of the electric field, and of plasma-etching the organic-material film of the substrate by means of the plasma partway in order to form a groove having a flat bottom with a width not less than 0.5 μm, wherein, in the etching step, the frequency of the first high-frequency electric power is 50 MHz to 150 MHz, the frequency of the second high-frequency electric power is 500 kHz to 27 MHz, the first and second frequencies are applied concurrently in order to achieve high etching rates, a pressure in the chamber is 53 to 133 Pa, a self-bias electric voltage of the electrode supporting the substrate to be processed is not higher than 600 V, and a residence time of the process gas in the chamber is 70 to 180 msec, to achieve high plasma density, low self-bias voltage, uniform plasma and inhibition of micro-trenching.

2. A plasma etching method according to claim 1, wherein the process gas comprises at least one selected from an $N_2$ gas, an $H_2$ gas, an $O_2$ gas, a CO gas, an $NH_3$ gas, a $C_xH_y$ gas (x, y are natural numbers) and a rare gas.

3. A plasma etching method according to claim 1, wherein the organic-material film includes O, C and H.

4. A plasma etching method according to claim 1, wherein the organic-material film includes Si, O, C and H.

5. A plasma etching method according to claim 1, wherein the organic-material film has a low dielectric constant.

6. A plasma etching method according to claim 1, wherein a distance between the pair of electrodes is shorter than 50 mm.

* * * * *